United States Patent [19]

Kawata et al.

[11] Patent Number: 5,337,270
[45] Date of Patent: Aug. 9, 1994

[54] SEMICONDUCTOR DYNAMIC MEMORY

[75] Inventors: Koji Kawata; Tadahiko Sugibayashi, both of Tokyo, Japan

[73] Assignee: NEC Corporation, Tokyo, Japan

[21] Appl. No.: 935,162

[22] Filed: Aug. 26, 1992

[30] Foreign Application Priority Data

Aug. 26, 1991 [JP] Japan .................................. 3-212546

[51] Int. Cl.⁵ ............................................. G11C 11/24
[52] U.S. Cl. ..................................... 365/149; 365/203; 365/207; 365/189.01
[58] Field of Search ............ 365/149, 203, 207, 189.01, 365/226, 227, 228

[56] References Cited

U.S. PATENT DOCUMENTS 4,943,960 7/1990 Komatsu et al. ...................... 365/203
4,965,769 10/1990 Etoh et al. ............................ 365/149

OTHER PUBLICATIONS

S. Saito et al., "A 1MB CMOS DRAM with Fast Page Static Column Modes", 1985 IEEE International Solid State Circuits Conference Digest of Technical Papers, pp. 252–253.

Primary Examiner—Eugene R. LaRoche
Assistant Examiner—Huan Hoang
Attorney, Agent, or Firm—Sughrue, Mion, Zinn, Macpeak & Seas

[57] ABSTRACT

A DRAM according to the invention is provided with a memory cell array formed by arranging in the row and column directions one-transistor-one-capacitor type memory cells; bit lines, precharged at a prescribed timing, for performing the transfers of write-in/read-out data to and from the memory cells; a sense amplifier including a first transistor, whose drains are connected to the bit lines to bias the substrate to a prescribed potential, and a second transistor whose drains and sources are connected to the sources of the first transistor and a ground potential point, respectively, whose gates receive an activation control signal and whose substrate is biased to the same potential as the first transistor is, for amplifying the signals of said bit lines when activated; an intermediate potential generating circuit for supplying an intermediate potential which is substantially equal to ½ of the source potential to the opposite electrodes of said memories and to the bit lines; a power turn-on sensing circuit for generating a sensing signal which takes on an active level after the source potential reaches a prescribed level; and intermediate potential supply control means responsive to the sensing signal for controlling the supply of the intermediate potential to the bit lines.

The current sources of said first and second transistors are cut off, power consumption is thereby saved and the occurrence of a latch-up phenomenon suppressed by suspending the supply of the intermediate potential to the bit lines during the period in which, immediately after the power is turned on, the substrate potential rises and the threshold values of the first and second transistors drop to keep these transistors in an ON state.

11 Claims, 3 Drawing Sheets

SEMICONDUCTOR DYNAMIC MEMORY

BACKGROUND OF THE INVENTION

1. Field of the Invention

The present invention relates to a semiconductor dynamic random access memory (DRAM), and more particularly to a DRAM whose configuration is such that the stored content of a memory cell is read out after the bit line is precharged with a potential equal or close to ½ of the power source potential.

2. Description of the Prior Art

In a DRAM in which a large number of memory cells of a one-transistor-one-capacitor type, each consisting of a switching transistor, of which one source electrode and one drain electrode are connected to a bit line and the gate electrodes are connected to a word line, and a capacitance element (cell capacitance) with one of its electrodes connected to the other source electrode and drain electrode of the switching transistor, are arranged in both row and column directions, the other electrode of each cell capacitance (the opposite cell electrode) is often biased to a potential equal to ½ of the power source potential for the purpose of increasing the reliability by easing the voltage stress applied to the memory cells.

In connection with the biasing of the opposite cell electrode to a potential equal to ½ (intermediate potential) of the source potential, the bit line is precharged with said intermediate potential before the stored content of a memory cell is read out. When the stored content of the memory cell is read out, the potential of the bit line to which the memory cell belongs becomes slightly higher or lower than the intermediate potential in response to the stored content. A sense amplifier compares the potential of this bit line with the intermediate potential, and amplifies it either to the source potential level or the ground potential level in response to its difference from the intermediate potential. The potential level representing the stored content of the memory cell is thereby established. Since the sense amplifier then only has to amplify the potential of the bit line from around the intermediate potential to the source potential or the ground potential, the read-out speed is faster than in a system in which the precharge potential of the bit line is amplified to a level equal to the source potential. Thus a DRAM of a system in which the opposite cell electrode is biased to an intermediate potential and the bit line is precharged with this intermediate potential is more reliable and permits faster read-out. Therefore, many kinds of DRAM's using this system have been developed (see, for instance, 1985 IEEE International Solid State Circuits Conference DIGEST OF TECHNICAL PAPERS, pp. 252–253, "A 1 MB CMOS DRAM with Fast Page Static Column Modes").

The sense amplifier in the aforementioned DRAM is provided, for instance, with an N-channel type first transistor of which the drain electrodes are connected to the bit line of the object of read-out (object bit line) and the gate electrodes are connected to another bit line (non-object bit line) than said object bit line; an N-channel type second transistor of which the drain electrodes are connected to said non-object bit line; the gate electrodes are connected to said object bit line and the source electrodes are connected to the source electrode of said first transistor; an N-channel type third transistor of which the drain electrodes are connected to the source electrodes of said first and second transistors, the source electrodes are connected to a ground potential point, and the gate electrodes receive an activation control signal; a P-channel type fourth transistor of which the source electrodes are connected to power source terminals, the drain electrodes are connected to said object bit line and the gate electrodes are connected to said non-object bit line; and a P-channel type fifth transistor of which the source electrodes are connected to said power source terminals, the drain electrodes are connected to said non-object bit line and the gate electrodes are connected to said object bit line.

To the P-type substrate over which the N-channel type first, second and third transistors of this sense amplifier are formed is applied a negative potential generated in a substrate potential generating circuit in order to raise the threshold voltages of these transistors. On this P-type substrate are also formed, with an insulating film in-between, power supply terminals and power supply wiring for supplying power from an external source to circuits including the substrate potential generating circuit. The intermediate potential supplied to the opposite cell electrodes and bit lines are generated by an intermediate potential generating circuit to which power is supplied from an external source.

When the power supply to this DRAM is turned on and the source potential begins to rise, the potential of said substrate is first raised by the parasitic capacitance of the power supply terminals and the power supply wiring, which are directly connected to the power source, with the substrate, because the output of said substrate potential generating circuit has a delay time. As the substrate potential rises, the threshold voltages of the N-channel type first, second and third transistors of the sense amplifier drop, and these transistors achieve continuity. At this time, since the intermediate potential is supplied to the opposite cell electrodes and the bit lines by the intermediate potential generating circuit, a current due to this intermediate potential flows to the ground potential point through the bit lines and the first, second and third transistors. As a result, a leakage current occurs from the channels of these transistors to the substrate, resulting in a further rise in the potential of the substrate and a further increase in current due to the intermediate potential.

In this state, the PNPN junction parts between these N-channel type transistors and P-channel type fourth and fifth transistors become susceptible to a latch-up phenomenon, which would make a current keep flowing to the PNPN junction parts, thereby inviting not only failure of the circuits to function normally but also breakdowns of circuit elements.

Unless a latch-up phenomenon occurs, as the absolute value of the negative substrate potential due to the substrate potential generating circuit increases with the lapse of time, resulting in the biasing of the P-type substrate of the N-channel type transistors of the sense amplifier to a negative potential, the threshold values of these N-channel type transistors return to their normal level, and these transistors are turned off. After that, this DRAM can resume normal operation.

However, if the number of sense amplifiers is increased to expand the memory capacity, there will arise an increase in the current flowing to the N-type transistors of the sense amplifiers due to the rise in substrate potential at the time the power supply is turned on, inviting a corresponding increase in power consumption.

BRIEF SUMMARY OF THE INVENTION

Object of the Invention

An object of the present invention, therefore, is to provide a DRAM which can restrain the increase of a current flowing through the intermediate potential generating circuit, bit lines and sense amplifier attributable to the rise in substrate potential at the time the power supply is turned on, thereby reducing power consumption and, at the same time, avoiding the occurrence of a latch-up phenomenon.

Summary of the Invention

According to the invention, there is provided a DRAM equipped with a memory cell array formed by arranging in the row and column directions one-transistor-one-capacitor type memory cells for biasing opposite cell electrodes to an intermediate potential equal to ½ of the power source potential; a precharge circuit for precharging bit lines connected to said memory cells with the intermediate potential at a prescribed timing; an intermediate potential generating circuit for generating said intermediate potential; a sense amplifier, connected to said bit lines, for amplifying the variation of the potential of those bit lines; a power turn-on sensing circuit for generating a power ON sensing signal, which varies from an inactive level to an active level in response to a prescribed potential reached by the power source potential supplied to a power supply terminal; and intermediate potential supply control means for supplying said intermediate potential to said precharge circuit when said power ON sensing signal is at its active level and suspending its supply when the signal is at its inactive level.

Since this DRAM, with its power turn-on sensing circuit and intermediate potential supply control means mentioned above, prevents the supply of the intermediate potential to the bit lines after the power supply is turned on until the power supply terminals reach a prescribed source potential, no current from the intermediate potential generating circuit will flow to the N-channel type transistors of the sense amplifier even if these transistors are given continuity by the rise of the potential of their P-type substrate immediately after the power is turned on. Therefore, power consumption can be saved, and the occurrence of a latch-up phenomenon in the NPNP junctions including the N-channel type transistors can be suppressed.

BRIEF DESCRIPTION OF THE DRAWINGS

The above-mentioned and other objects, features and advantages of the present invention will become more apparent from the following detailed description of the invention when taken in conjunction with the accompanying drawings, wherein.

DETAILED DESCRIPTION OF THE PREFERRED EMBODIMENTS

Figure 1:
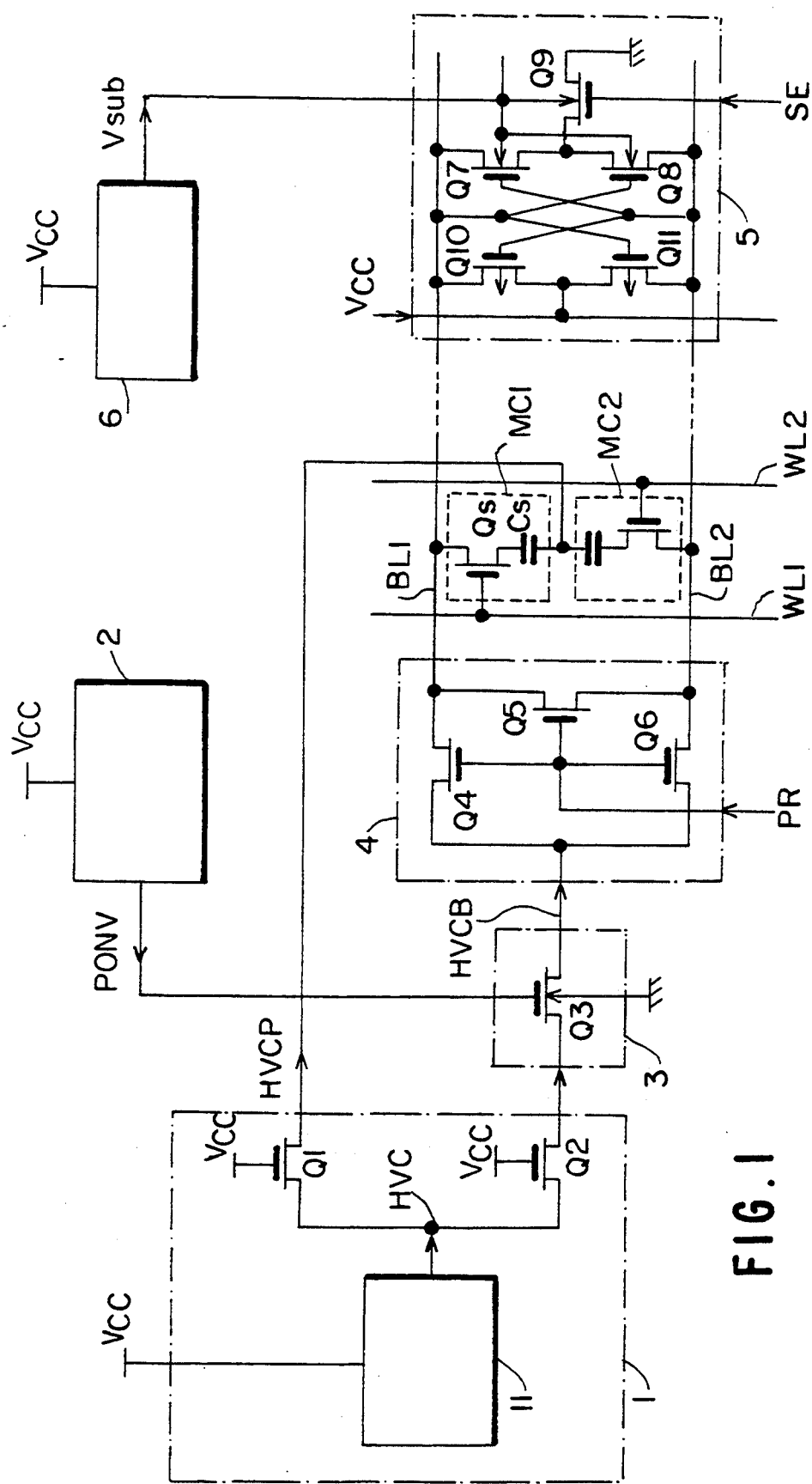
FIG. 1 is a circuit diagram of a first preferred embodiment of the invention.

Referring to FIG. 1, a DRAM illustrated therein, which is a first preferred embodiment of the present invention is provided with memory cells MC1 and MC2 each including a switching transistor Qs and a capacitance element (cell capacitance) Cs one of whose electrodes is connected to one source electrode and one drain electrode of the switching transistor Qs; in MC1 and MC2 word lines WL1/WL2, connected symmetrically to the gate electrodes of the switching transistors Qs of these memory cells MC1 and MC2, respectively, for supplying address signals for the selection of these memory cells; a pair of bit lines BL1/BL2, connected symmetrically to the respective source electrodes and the other drain electrodes of the switching transistors Qs of these memory cells MC1 and MC2, respectively, for giving and receiving write-in/read-out data between these memory cells; an intermediate potential generating circuit 1 including an intermediate potential generating section 11, connected to a power supply terminal, for supplying an intermediate potential HVC which is substantially equal to ½ of a source potential Vcc from this terminal, a transistor Q1, of which one source electrode and one drain electrode are connected to the output end of the intermediate potential generating section 11 and the other source electrode and the other drain electrode are connected to the other electrodes (the opposite cell electrodes) of the cell capacitances Cs of the memory cells MC1 and MC2, and whose gate electrodes are supplied with the source potential Vcc to generate an intermediate potential HVCP for said opposite cell electrodes, and a transistor Q2, of which one source electrode and one drain electrode are connected to the output end of the intermediate potential generating section 11 and whose gate electrodes are supplied with take source potential Vcc to generate an intermediate potential HVCB from the other source electrode and the other drain electrode; a precharge circuit 4, including transistors Q4, Q5 and Q6, responsive to a precharge control signal PR from a timing pulse source (not shown) for precharging the bit lines BL1/BL2 with the intermediate potential HVCB at a prescribed timing; a sense amplifier 5, including an N-channel type transistor Q7 of which the drain and gate electrodes are connected to the bit line BL1 and the bit Line BL2, respectively, an N-channel type transistor Q8 of which the drain, gate and source electrodes are connected to the bit line BL2, the bit line BL1 and the source electrodes of the transistor Q7, respectively, an N-channel type transistor Q9 of which the drain and source electrodes are connected to the source electrodes of the transistors Q7 and Q8 and to a ground potential point, respectively, and whose gate electrodes receive an activation control signal SE from said timing pulse source, a P-channel type transistor Q10 of which the drain and gate electrodes are connected to the bit line BL1 and the bit line BL2, respectively, and whose source electrodes receive the supply of the source potential Vcc, and a P-channel type transistor Q11 of which the drain and gate electrodes are connected to the bit line BL2 and the bit line BL1, respectively, and whose source electrodes receive the supply of the source potential Vcc, for amplifying the difference in potential between the bit lines BL1/BL2; a substrate potential generating circuit 6, which receives the supply of the source potential Vcc, for generating a negative substrate potential Vsub and supplying it to the substrate of the transistors Q7, Q8 and Q9 of the sense amplifier 5; a power supply turn-on sensing circuit 2 for generating a power ON sensing signal PONV, which varies from an inactive level to an active level in response to a prescribed potential (5.0 V, for example) reached by said power supply terminal when the power supply is turned on; and an intermediate potential supply control circuit 3, consisting of a transistor Q3, of which one source electrode and one drain electrode are connected to the other source electrode and the other drain electrode of the transistor Q2 of the intermediate potential generating circuit 1 and the other electrodes are connected to the intermediate potential input end of the precharge circuit 4, and whose gate electrodes receive the supply of the power ON sensing signal PONV, for supplying the intermediate potential HVCB to the precharge circuit 4 when the power ON sensing signal PONV is at its active level and suspending its supply when the signal is at its inactive level. The semiconductor substrate on which the sense amplifier 5 is formed and the substrate on which the intermediate potential supply control circuit 3 is formed are separated from each other, and the latter substrate is connected to the ground potential point.

Figure 2:
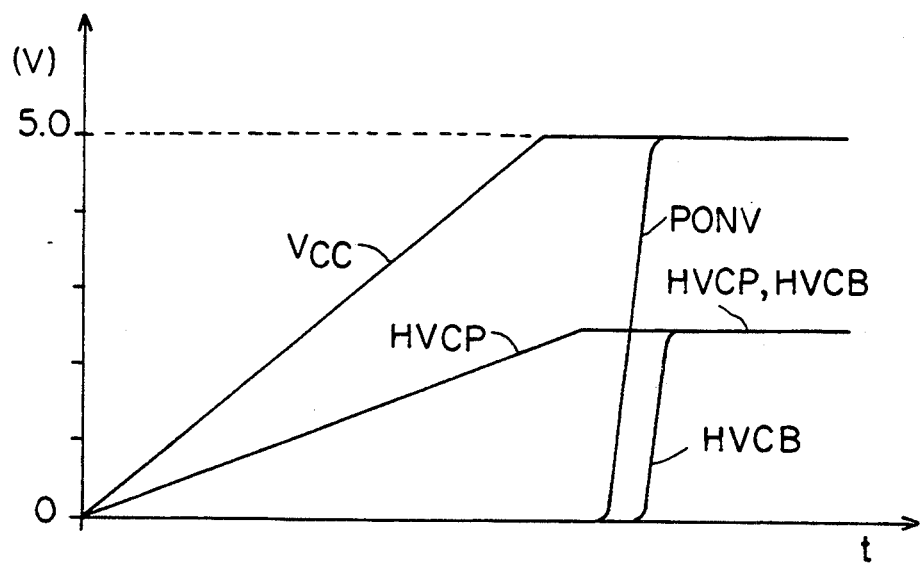
FIG. 2 is a diagram showing voltage waveforms in different parts of this preferred embodiment.

Referring now to FIG. 2 which shows voltage waveforms in different parts from the time the potential Vcc of the power supply terminal begins to rise as the power supply is turned on until the time the potential Vcc reaches the usual stable operational potential, the output of the substrate potential generating circuit 6, i.e. the variation in substrate potential Vsub, lags behind the rise of the source potential Vcc on account of the threshold voltages and forward voltages of the constituent parts of this circuit 6 and the parasitic capacitances of these constituent parts.

On the other hand, the potential of the substrate on which the sense amplifier 5 is formed rises simultaneously with the rise of the source potential Vcc on account of the parasitic capacitance of the power source, formed on this substrate with an insulating film in-between, with the substrate of the directly connected power supply terminal and the power supply wiring.

As the substrate potential rises, the threshold voltages of the N-channel type transistors Q7, Q8 and Q9 of the sense amplifier 5 drop, and these transistors achieve continuity. At this point of time, the precharge circuit 4 is in the period of precharging the bit lines BL1/BL2, and the output HVCP/HCVB of the intermediate potential generating circuit i begins to rise gradually, though lagging behind the power source potential Vcc.

In a DRAM according to the prior art, since the output end of the intermediate potential generating circuit 1 and the intermediate potential input end of the precharge circuit 4 are directly connected, a current flows through the intermediate potential generating circuit 1, precharge circuit 4, bit lines BL1/BL2, and transistors Q7, Q8 and Q9, and this current leaks to the substrate to make its potential further rise and invite a latch-up phenomenon.

By contrast, the present invention provides for the insertion of the intermediate potential supply control circuit 3, composed of the transistor Q3, between the output end of the intermediate potential generating circuit 1 and the intermediate potential input end of the precharge circuit 4 to keep the transistor Q3 in an OFF state with the inactive level (low level) of the power ON sensing signal PONV until the output of the substrate potential generating circuit 6, i.e. the substrate potential Vsub, reaches a prescribed negative level (for instance, until the power source potential Vcc stabilizes at its maximum level, 5.0 V) and to suspend the supply of the intermediate potential HVCB to the precharge circuit 4, so that no current flows to the transistors Q7, Q8 and Q9 even if they are in an ON state. As the rise of the substrate potential of the sense amplifier 5 is limited to a brief period, due to the parasitic capacitances of the power supply terminal power supply wiring, when the power supply is turned on, the substrate of this sense amplifier 5 quickly follows the negative substrate potential Vsub from the substrate potential generating circuit 6, and the transistors Q7, Q8 and Q9 are turned OFF. Thus, the sense amplifier 5 achieves a normal operating state.

After that, the power ON sensing signal PONV takes on its active level (high level) to turn the transistor Q3 into an ON state to let the intermediate potential HVCB from the intermediate potential generating circuit 1 be supplied to the precharge circuit 4, and this DRAM enters into its usual operating state.

In this manner, the current flowing through the intermediate potential generating circuit, bit lines and sense amplifier, attributable to the rise of the substrate potential at the time the power supply is turned on, can be reduced to save power consumption and, at the same time, to suppress the latch-up phenomenon.

Whereas it is usual for the substrate on which the sense amplifier 5 is formed and that on which the intermediate potential supply control circuit 3 is formed to be separated and insulated from each other, all the circuits may be formed on the same substrate, which is biased to a negative potential. In this case, the transistor Q3 of the intermediate potential supply control circuit 3, like the transistors Q7, Q8 and Q9 of the sense amplifier 5, enters into an ON state when the power supply is turned on, making it impossible to suspend the supply of the intermediate potential HVCB to the precharge circuit 4 (although the rise of the substrate potential is somewhat eased by the ON resistance of the transistor Q3).

Figure 3:
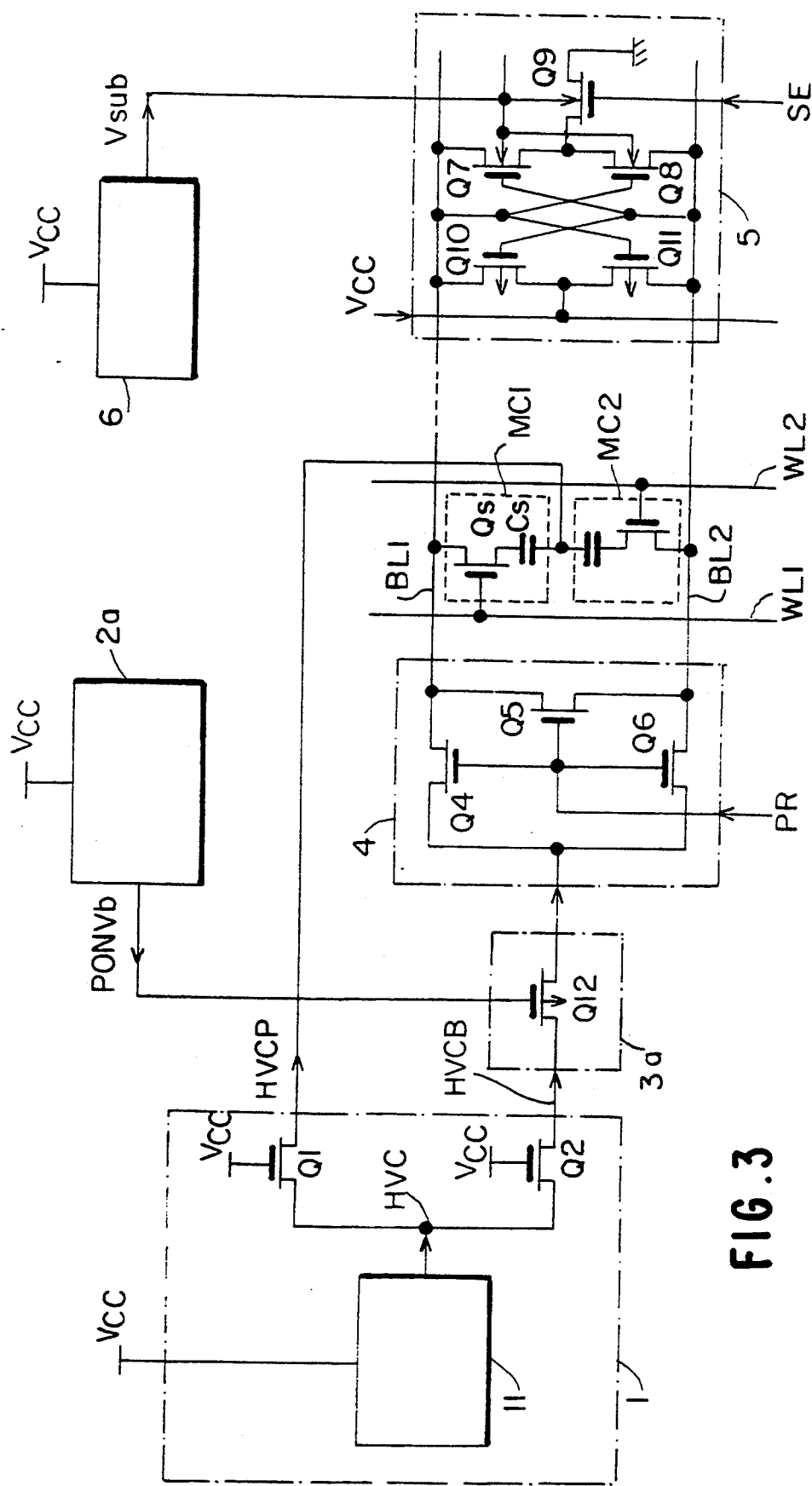
FIG. 3 is a circuit diagram, partially including a block diagram, of a second preferred embodiment of the invention.

Referring to FIG. 3 illustrating a second embodiment of the present invention suitable for such a case, in which common constituent elements with the first embodiment are denoted by respectively the same reference numerals, a transistor Q12 of an intermediate potential supply control circuit 3a consists of a P-channel type transistor. In this second embodiment, the P-channel type transistor Q12 is usually formed in an N well, formed in a P-type substrate on which the N-channel type transistors Q7, Q8 and Q9 of the sense amplifier 5 are formed. Since the potential of the N well, therefore, can be set irrespective of the P-type substrate, the transistor Q12 of the intermediate potential supply control circuit 3a can be prevented from entering into an ON state even if the potential of the P-type substrate rises with the rise of the power source potential Vcc when the power supply is turned on.

Figure 4:
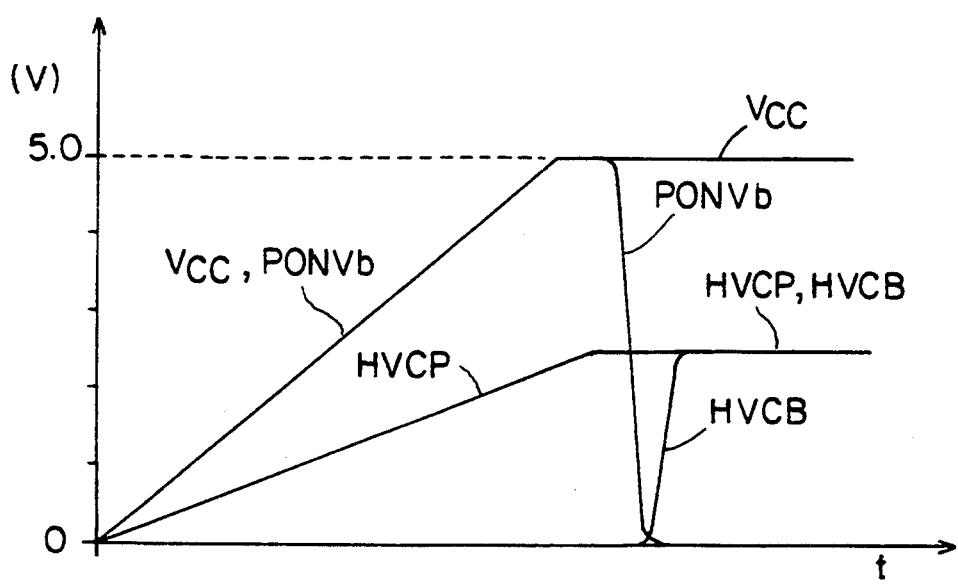
FIG. 4 is a diagram showing voltage waveforms in different parts of this preferred embodiment.

Referring now to FIG. 4 which shows voltage waveforms in different parts of this embodiment, since the transistor Q12 of the intermediate potential supply control circuit 3a is a P-channel type one, a power ON sensing signal PONVb is a signal which varies from an inactive level (the same potential as the source potential Vcc) to the ground potential when the power source potential Vcc has reached a prescribed level (for instance, its maximum level, 5.0 V). When the power source voltage Vcc has stabilized at 5.0 V and the substrate has been negatively biased by the substrate potential Vsub, the transistor Q12 is turned ON by this power ON sensing signal PONVb, and the intermediate potential HVCB is supplied to the precharge circuit 4. After that, this DRAM enters into its usual operating state.

In this embodiment, the intermediate potential supply control circuit 3a can also be built into the intermediate potential generating circuit 1a.

That is, instead of connecting the gate electrodes of the transistor Q2 in this embodiment to the source of the Vcc potential, it is connected to the output of the circuit 2 to receive the supply of the power ON sensing signal PONV, and its substrate is connected to the ground potential point to enable the transistor Q2 to perform the intermediate potential supply control function as well.

Whereas the above-described embodiments and their Modifications have configurations in which the sense amplifier 5 undergoes activation control by the transistor Q9 which is turned ON and OFF in response to the activation control signal SE, the present invention is also applicable to a DRAM including a sense amplifier subjected to activation control by a first activation control signal (SAP) which brings the source electrodes of the P-channel type transistors Q10 and Q11 to the intermediate potential when inactivated or to the power source potential Vcc when activated and a second activation control signal (SAN) which brings the source electrodes of the N-channel type transistors Q7 and Q8 to the intermediate potential when inactivated or to the ground potential when activated.

Although the invention has been described with reference to specific embodiment embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A dynamic RAM having:
    a memory cell array formed by arranging memory cells, each including a switching transistor and a capacitance element one of whose electrodes is connected to one each of the source and drain electrodes of this switching transistor, in rows and columns;
    word lines connected to the gate electrodes of said switching transistors for selecting a memory cell for each of said rows;
    bit lines connected to the other sources and drain electrodes of said switching transistors, for performing transfers of write-in/read-out data between said memory cells for each of said columns;
    an intermediate potential generating circuit for generating an intermediate potential which is substantially equal to ½ of a source potential supplied from a power supply terminal, supplying it to the other electrodes of said cell capacitance elements and further supplying it to a precharging potential line;
    a precharging circuit coupled between said bit lines and a circuit node for precharging said bit lines with a potential at said circuit node at a prescribed timing;
    a sense amplifier, including a first transistor having a drain electrode connected to a first one of said bit lines, a gate electrode connected to a second one of said bit lines and a substrate receiving a prescribed potential, and a second transistor having a drain and a source electrode respectively connected to a source electrode of said first transistor and a ground potential point, a gate electrode receiving an activation control signal and a substrate receiving said prescribed potential, for amplifying variations of the potentials of said bit lines;
    a power supply turn-on sensing circuit for generating a power-ON sensing signal which takes an inactive level in response to the source potential to said power terminal being turned on, holds said inactive level until the source potential reaches a predetermined level and changes to an active level after the source potential reaches said predetermined level; and
    intermediate potential supply control means coupled between said precharging potential line and said circuit node for preventing said intermediate potential from being supplied to said circuit node when said power-ON sensing signal is at said inactive level and for allowing said precharging potential to be supplied to said circuit node when said power-ON sensing signal is at said active level.

2. A dynamic RAM as claimed in claim 1, wherein said intermediate supply control means consists of a third transistor connected between said precharging potential line and said circuit node and supplied at a gate thereof with said power-ON sensing signal.

3. A dynamic RAM as claimed in claim 2, wherein said third transistor is of the same conductivity type as the first and second transistors of said sense amplifier, and is formed on a substrate separated from the substrate of these first and second transistors.

4. A dynamic RAM as claimed in claim 3, wherein the substrate of said third transistor is connected to the ground potential point.

5. A dynamic RAM as claimed in claim 2, wherein said third transistor is a transistor formed on a substrate of a conductivity opposite to that of said first and second transistors.

6. A dynamic RAM as claimed in claim 1, wherein said intermediate potential generating circuit includes intermediate potential supply control means consisting of an intermediate potential generating section for supplying an intermediate potential which is substantially equal to ½ of the source potential supplied from said power supply terminal, a fourth transistor connected between an intermediate potential output end of said intermediate potential generating section and the other of said electrodes of said capacitance elements and a gate supplied with said source potential, and a fifth transistor connected between the intermediate potential output end of said intermediate potential generating section and said precharging potential line and having a gate supplied with said source potential.

7. A random access memory device, comprising: a memory cell array including:
    a plurality of word lines;
    a plurality of pairs of bit lines; and
    a plurality of memory cells each disposed on a different one of intersections of said word and bit lines;
    a plurality of sense amplifiers provided correspondingly to said pairs of bit lines;

a plurality of precharging circuits provided correspondingly to said pairs of bit lines, each of said precharging circuits being coupled to an associated one of said pairs of bit lines and a first node to precharge said associated one of said pairs of bit lines with a potential level on said first node;

a voltage generator generating and supplying an intermediate voltage of a power voltage to a second node;

a power-on detection circuit generating a control signal which takes an inactive level in response to said power voltage being turned on, holds said inactive level until said power voltage reaches a predetermined level and changes to an active level after said power voltage reaches said predetermined level; and a first transistor connected between said first and second nodes and supplied with said control signal, said transistor being rendered nonconductive in response to said inactive level of said control signal to prevent said intermediate voltage from being transferred from said second node to said first node and rendered conductive in response to said active level of said control signal to allow said intermediate voltage to be transferred from said second node to said first node.

8. The memory device as claimed in claim 7, wherein each of said memory cells includes a transfer gate transistor and a capacitor connected in series between an associated one of said bit lines and a potential node supplied with said intermediate voltage and wherein said transfer gate transistor has a gate connected to an associated one of said word lines.

9. The memory device as claimed in claim 8, wherein each of said sense amplifiers includes second and third transistors cross-coupled between an associated pair of said pairs of bit lines, and wherein said memory device further comprises a substrate voltage generator responding to said power voltage and generating a substrate voltage, said substrate voltage being supplied to substrates of said second and third transistors.

10. The memory device as claimed in claim 9, wherein each of said first, second and third transistors has a channel type equal to one another.

11. The memory device as claimed in claim 9, wherein said first transistor has one channel type and each of said second and third transistors has an opposite channel type.

* * * * *

UNITED STATES PATENT AND TRADEMARK OFFICE
CERTIFICATE OF CORRECTION

PATENT NO. : 5,337,270
DATED : August 9, 1994
INVENTOR(S) : Kawata et al.

It is certified that error appears in the above-indentified patent and that said Letters Patent is hereby corrected as shown below:

Delete the last paragraph of the ABSTRACT.

Col. 5, line 50, delete "i" and insert --1--.

Col. 7, line 34, delete "embodiment".

Signed and Sealed this

Seventh Day of February, 1995

Attest:

BRUCE LEHMAN

Attesting Officer        Commissioner of Patents and Trademarks